United States Patent
Boskamp (10) Patent No.: US 9,581,665 B2
(45) Date of Patent: Feb. 28, 2017

(54) SYSTEMS AND METHODS FOR DAMPING COMMON-MODE ENERGY

(75) Inventor: Eddy Benjamin Boskamp, Pewaukee, WI (US)

(73) Assignee: General Electric Company, Schenectady, NY (US)

(*) Notice: Subject to any disclaimer, the term of this patent is extended or adjusted under 35 U.S.C. 154(b) by 1169 days.

(21) Appl. No.: 13/452,315

(22) Filed: Apr. 20, 2012

(65) Prior Publication Data

US 2013/0278264 A1    Oct. 24, 2013

(51) Int. Cl.
*G01R 33/36* (2006.01)

(52) U.S. Cl.
CPC .................. *G01R 33/3685* (2013.01)

(58) Field of Classification Search
CPC .................................................. G01R 33/3685
USPC .. 324/300–322; 600/407–435; 382/128–131; 607/116
See application file for complete search history.

(56) References Cited

U.S. PATENT DOCUMENTS

| | | | |
|---|---|---|---|
| 7,215,120 B2* | 5/2007 | Vaughan | 324/318 |
| 7,378,851 B1 | 5/2008 | de Rooij et al. | |
| 7,498,813 B2 | 3/2009 | Giaquinto et al. | |
| 7,626,390 B2 | 12/2009 | Gleich et al. | |
| 7,652,476 B2 | 1/2010 | de Rooij et al. | |
| 7,917,213 B2* | 3/2011 | Bulkes | A61N 1/05 607/9 |
| 8,207,737 B2* | 6/2012 | Greim | G01R 33/3685 324/309 |
| 8,233,985 B2* | 7/2012 | Bulkes | A61N 1/37211 607/36 |
| 8,285,396 B2* | 10/2012 | Bulkes | A61N 1/05 607/115 |
| 9,213,072 B2* | 12/2015 | Taracila | G01R 33/3685 |
| 2006/0258936 A1 | 11/2006 | Schulz | |
| 2007/0201178 A1* | 8/2007 | Reykowski | 361/119 |
| 2007/0257670 A1 | 11/2007 | Giaquinto et al. | |
| 2008/0033497 A1* | 2/2008 | Bulkes | A61N 1/05 607/9 |
| 2008/0051854 A1* | 2/2008 | Bulkes | A61N 1/37211 607/60 |

(Continued)

FOREIGN PATENT DOCUMENTS

| | | |
|---|---|---|
| CN | 1344928 A | 4/2002 |
| CN | 1399141 A | 2/2003 |

(Continued)

OTHER PUBLICATIONS

Transmission line; Mar. 22, 2012; Wikipedia.*

(Continued)

*Primary Examiner* — Melissa Koval
*Assistant Examiner* — Tiffany Fetzner
(74) *Attorney, Agent, or Firm* — Dean D. Small; The Small Patent Law Group, LLC.

(57) ABSTRACT

Systems and methods for damping cable common-mode energy in magnetic environments are provided. One system includes a damping arrangement having a transmission line within an electric (E) field environment and an energy damping device formed having a conductive plastic body and positioned adjacent a conductor of the transmission line. The energy damping device is configured to dampen common-mode energy induced within the transmission line by the E field environment.

29 Claims, 8 Drawing Sheets

(56) References Cited

U.S. PATENT DOCUMENTS

| | | | |
|---|---|---|---|
| 2008/0243218 A1* | 10/2008 | Bottomley | A61N 1/05 607/116 |
| 2008/0262584 A1* | 10/2008 | Bottomley | A61N 1/05 607/119 |
| 2010/0148775 A1* | 6/2010 | Greim | G01R 33/3685 324/309 |
| 2010/0174348 A1* | 7/2010 | Bulkes | A61N 1/05 607/116 |
| 2010/0208397 A1 | 8/2010 | Johnson et al. | |
| 2011/0291657 A1 | 12/2011 | Davila et al. | |
| 2013/0220032 A1* | 8/2013 | Packirisamy et al. | 73/862.624 |
| 2013/0256302 A1* | 10/2013 | Chu | H05B 6/6447 219/709 |
| 2013/0278264 A1* | 10/2013 | Boskamp | G01R 33/3685 324/318 |
| 2013/0328565 A1* | 12/2013 | Taracila | G01R 33/3685 324/322 |
| 2014/0190960 A9* | 7/2014 | Chu | H05B 6/6447 219/709 |

FOREIGN PATENT DOCUMENTS

| | | | |
|---|---|---|---|
| CN | 101571577 A | 11/2009 | |
| CN | 102346241 A | 2/2012 | |
| EP | 0927890 A2 | 7/1999 | |
| JP | H0295347 A | 4/1990 | |

OTHER PUBLICATIONS

Electrical resistivity and conductivity; Apr. 16, 2012; Wikipedia.*
Relative permittivity; Apr. 17, 2012; Wikipedia.*
Chinese Office Action for corresponding CN 2016101901587050 dated Oct. 24, 2016; 7 pages.

* cited by examiner

SYSTEMS AND METHODS FOR DAMPING COMMON-MODE ENERGY

BACKGROUND OF THE INVENTION

The subject matter disclosed herein relates generally to systems and methods for damping common-mode energy, such as for damping transmission line common-modes in Magnetic Resonance Imaging (MRI) systems.

Electric (E) fields generated by a system can induce currents and voltages that can interfere with the operation of that system. For example, MRI systems include a magnet, such as a superconducting magnet that generates a temporally constant (i.e., uniform and static) primary or main magnetic field. MRI data acquisition is accomplished by exciting magnetic moments within the primary magnetic field using radio-frequency RF coils. For example, in order to image a region of interest, the magnetic gradient coils are energized to impose a magnetic gradient to the primary magnetic field. RF transmit coils are then pulsed to create RF magnetic field pulses in a bore of an MRI scanner in order to acquire MR images of the region of interest using, for example, a phased array of RF receiver coils. The resultant image that is generated shows the structure and function of the region of interest.

In MRI systems, the RF coils, besides generating the RF magnetic fields needed for MRI, also generate E fields that induce currents and voltages within transmission lines (e.g., coaxial cables) connected to the one or more RF transmit (e.g., body) or receive coils. These induced voltages and currents, such as common-mode currents can interfere with the operation of the MRI system, such as with the tuning and matching of the RF coils in the MRI system. In order to suppress or dampen these induced modes, one or more balanced-unbalanced networks (baluns) are typically connected in series with the cable shield. However, these baluns are only narrow band parallel resonators and also get hot due to the high internal current during transmit pulses of the system.

BRIEF DESCRIPTION OF THE INVENTION

In accordance with various embodiments, a damping arrangement is provided that includes a transmission line within an electric (E) field environment and an energy damping device formed having a conductive plastic body and positioned adjacent a conductor of the transmission line. The energy damping device is configured to dampen common-mode energy induced within the transmission line by the E field environment.

In accordance with other embodiments, a magnetic resonance imaging (MRI) system is provided that includes an imaging portion having at least one transmit coil, a processing portion and a system interface interconnecting the imaging portion and the processing portion, wherein the system interface is connected to the at least one transmit coil with at least one transmission line. The MRI system also includes an energy damping device formed having a conductive plastic body and positioned adjacent a conductor of the transmission line, wherein the energy damping device is configured to dampen common-mode energy induced within the transmission line.

In accordance with yet other embodiments, a method for damping common-mode cable currents in an electric (E) field environment is provided. The method includes providing at least one conductive plastic patch having damping properties and positioning the at least one conductive plastic patch at a high voltage node of a transmission line within the E field environment to dampen common-mode energy induced in the transmission line by an E field of the E field environment.

DETAILED DESCRIPTION OF THE INVENTION

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for dissipating or damping induced currents and/or voltages in transmission lines. In particular, in some embodiments, induced energy, such as induced common-mode currents and/or voltages in transmission lines, for example cables of a Magnetic Resonance Imaging (MRI) system, are dissipated, dampened or suppressed. In one embodiment, a conductive plastic, for example, a carbon filled plastic is provided to dissipate, dampen or suppress induced currents and/or voltages in cables of the MRI system. By practicing various embodiments, the induced currents and/or voltages are dissipated, dampened or suppressed without interfering with coil tuning and provide a wider frequency bandwidth.

More particularly, one or more damping devices, which in various embodiments are conductive plastic devices that dampen transmission line common-modes, such as common-mode cable currents and/or voltages, are provided at high electric (E) field areas of a transmission lines (e.g., coaxial cables or striplines) of the MRI system, which correspond to high voltage locations along the transmission lines. For example, in some embodiments, a dissipative non-magnetic material, such as a carbon filled polypropylene is provided along at least a portion of one or more cables of the MRI system.

It should be noted that although various embodiments are described in an RF E field environment, such as may be present in an MRI system environment, the various embodiments may be implemented in connection transmission lines that are in magnetic environments, as well as non-magnetic environments. In general, the various embodiments may be implemented in an environment where E fields are generated that can induce currents and/or voltages in transmission lines within that environment.

Figure 1:
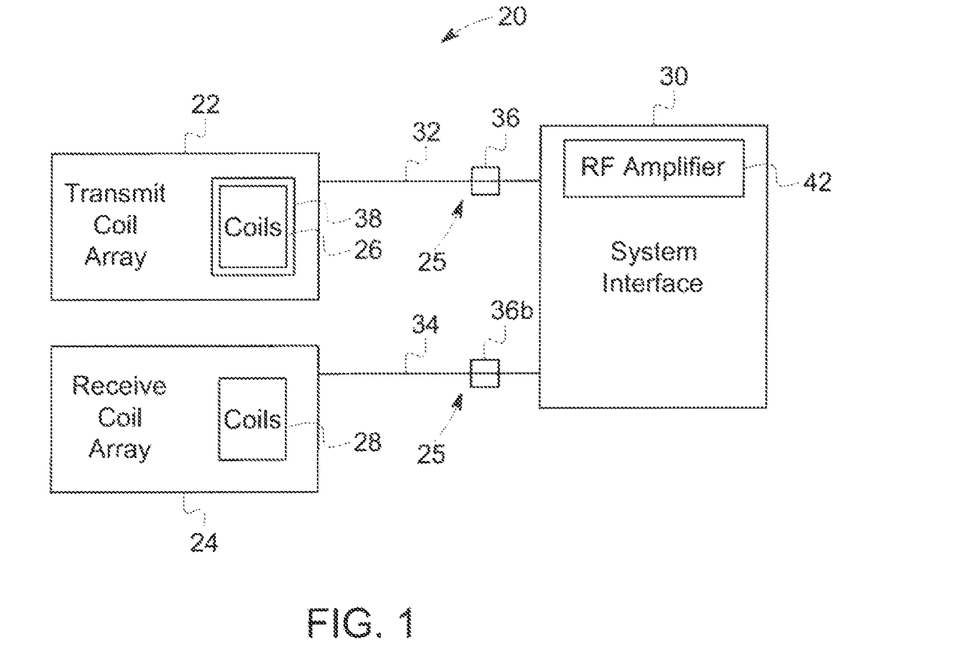
FIG. 1 is a block diagram of a transmit/receive section of a Magnetic Resonance Imaging (MRI) system having common-mode cable current damping devices in accordance with various embodiments.

As illustrated in FIG. 1, various embodiments may be implemented in connection with a transmit/receive section 20 of an MRI system. The transmit/receive section 20 is configured to acquire MR data using one or more coil arrays, illustrated as a transmit coil 22 and a receive coil array 24. The transmit coil 22 includes a single RF coil 26 and the receive coil array 24 includes a plurality of plurality of individual RF coils 28. For example, in one embodiment, the transmit coil 22 is an RF body coil, such as an RF birdcage coil. The RF body coil may be used as a whole-body RF coil. For a whole-body RF coil, the dimensions of the RF body coil are configured so that the RF body coil may be installed inside a superconducting magnet assembly or inside the bore of the MRI system. In some embodiments, the transmit coil 22 or the receive coil array 24 may be a local coil (e.g., a head coil or knee coil). It should be noted that the RF coil 26 and/or the RF coils 28 may be mounted on one or more coil formers (not shown). It also should be noted that in some embodiments, one or more individual or single receive RF coils 28 are provided instead of or in addition to the receive coil array 24.

The transmit coil 22 and receive coil array 24 are coupled to a system interface 30. In operation, the transmit coil 22 is configured to transmit RF pulses and the receive coil array 24 is configured to detect the MR signals, such as from a patient. In some embodiments, only a single coil array is provided, such that the coil array is configured to transmit RF pulses and also detect MR signals from the patient. It should be noted that an RF shield 38 may be provided around the transmit coil 22 to prevent the RF fields from penetrating the gradient coils (not shown) on the outside of the transmit coil 22, for example, on the outside of the body coil.

One or more connections or links are used to connect the transmit coil 22 and receive coil arrays 24 to the system interface 30. For example, in one embodiment, one or more transmission lines, such as coaxial cables 32 and 34 connect the transmit coil 22 and receive coil arrays to the system interface. It should be noted that single coaxial cables 32 and 34 are shown interconnecting the transmit coil 22 and receive coil arrays 24 with the system interface 30 for simplicity. However, in various embodiments, multiple coaxial cables 32 and/or 34 may be used, such as depending on the number of coils used, the number of channels, etc.

It also should be noted that a plurality of different coil arrangements may be provided, for example, to image different portions of the patient, such as the posterior and anterior sections of the patient. It also should be noted that the transmission lines are not limited to the coaxial cables 32 and 34, but may be any type of transmission line, for example, a stripline or microstripline.

The various embodiments also include one or more damping devices, illustrated as energy damping devices, for example, common-mode cable current and/or voltage damping devices, which in one embodiment are one or more conductive plastic devices 36 (e.g., conductive plastic patches) that are positioned along one or more regions or points of the transmission lines, such as the coaxial cables 32 and 34, to form a damping arrangement 25. For example, one or more conductive plastic devices 36 (one conductive plastic device 36 is shown in combination with coaxial cable 32 and one conductive plastic device 36b is shown in combination with coaxial cable 34 for simplicity) may be positioned adjacent and in contact with the coaxial cables 32 and 34 as described in more detail herein, which may be provided in an abutting arrangement where the conductive plastic devices 36 contact a shield of the coaxial cables 32 and 34. For example, in one embodiment, a conductive plastic device 36 is positioned along the coaxial cable 32 to dampen or suppress currents and/or voltages induced in the coaxial cable 32 by an E field generated by power (RF signals) supplied to the transmit coil 22 by an RF amplifier 42. The E field generated by a body RF transmit coil during a transmit pulse may be several 1000 V/m, thus resulting in a large inhomogeneous E field. As described in more detail below, induced energy, such as induced currents and/or voltages that generate unwanted frequencies are dampened or suppressed.

Figure 2:
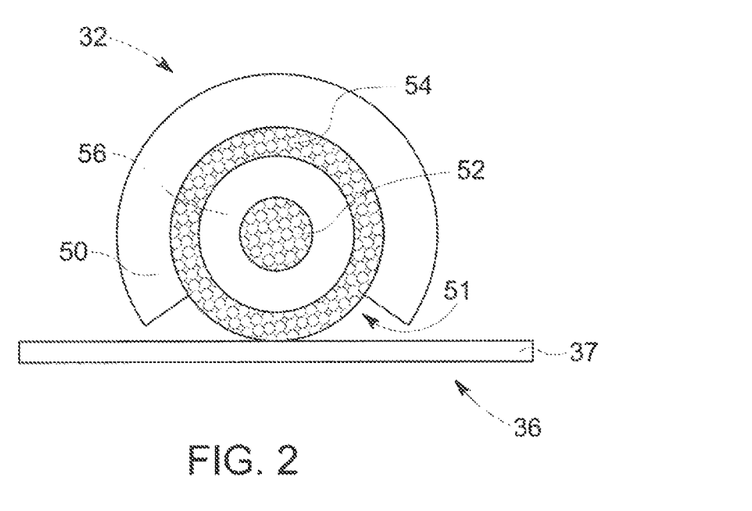
FIG. 2 is a cross-sectional view of a coaxial cable that may be part of the transmit/receive section of FIG. 1 illustrating a conductive plastic device formed in accordance with various embodiments.
Figure 3:
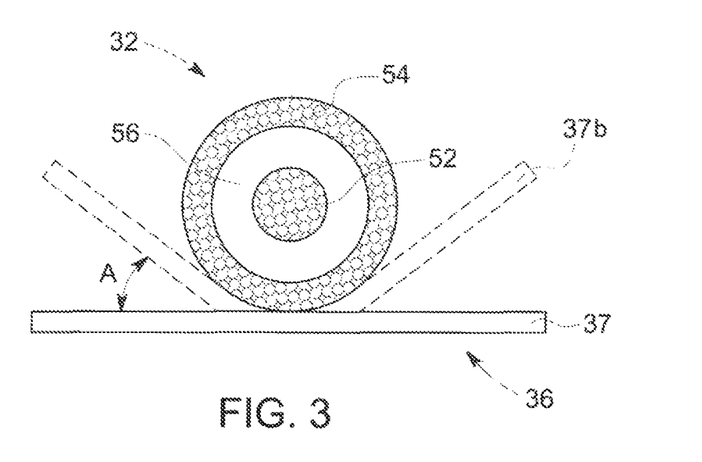
FIG. 3 is a cross-sectional view of another coaxial cable that may be part of the transmit/receive section of FIG. 1 illustrating a conductive plastic device formed in accordance with various embodiments.

The coaxial cables 32 and 34 may take different configurations and are one example of a type of transmission line in combination with which various embodiments may be used or implemented. In one embodiment, the coaxial cables 32 and 34 include an inner conductor surrounded by a flexible tubular insulating layer (e.g., a dielectric insulator), which is surrounded by a tubular conducting shield (e.g., metallic shield). In some embodiments, an outer cover or jacket (e.g., a plastic jacket) is removed or not provided. However, in the illustrated embodiment, a portion of the jacket is removed. In particular, FIG. 2 illustrates a cross-section of the coaxial cable 32. However, it should be noted that the coaxial cable 34 may have a similar configuration. The coaxial cable 32 includes an outer sheath 50 forming a sealed cover or casing with a portion 51 removed (e.g., a portion of the circumference of the outer sheath 50 cut along a length of the coaxial cable 32). In some embodiments, for example as shown in FIG. 3, the entire outer sheath 50 is removed along a portion of a length of the coaxial cable 32 or along the entire length of the coaxial cable 32. The amount of the outer sheath 50 removed may be varied.

The outer sheath 50 may be formed from different materials, for example, from a polyurethane material. When includes, the outer sheath 50 defines an axial length that encompasses and surrounds a portion of the electrical conductors therein. The outer sheath 50 may be configured as a cable jacket in some embodiments.

The coaxial cable 32 includes a first conductor 52 and a second conductor 54 (also referred to as a shield) that are arranged in a coaxial configuration within the outer sheath 50 such that the first and second conductors 52 and 54 are concentrically aligned within the outer sheath 50 about a central axis of the coaxial cable 32. The first conductor 52 is a center conductor formed from an electrically conductive material (e.g., one or more strands of an electrically conductive material, such as copper). The second conductor 54 may be similarly formed.

The first conductor 52 is surrounded by an inner sheath 56, which separates the first conductor 52 from the second conductor 54 (e.g., coaxial and radially spaced apart). The inner sheath 56 may be formed from a dielectric insulating material (e.g., a solid polyethylene insulator).

As can be seen in FIGS. 2 and 3, the conductive plastic device 36 is positioned in contact with the shield of the coaxial cable 32, namely the second conductor 54. For example, in one embodiment the conductive plastic device 36 is positioned or located adjacent and in physical contact with a portion (e.g., along about 10 degrees of the circumference) of the second conductor 54 of the coaxial cable 32. The conductive plastic device 36 in the illustrated embodiment includes a body 37 that is a generally planar conductive plastic structure, for example, a plastic impregnated with carbon particles. An example body 37b is also shown in dashed lines depicting a non-planar conductive plastic structure. It should be noted that the conductive plastic device 36 may be positioned along different circumferential portions of the second conductor 54.

In the various embodiments, the coaxial cable 32 is positioned generally along a centerline or in the middle of the conductive plastic device 36. Thus, the center or center portion of the conductive plastic device 36 is in contact with or touches the second conductor 54 of the coaxial cable 32 such that in various embodiments radial symmetry is provided.

The conductive plastic device 36 may be coupled to the second conductor 54 of the coaxial cable 32 in some embodiments, for example, using an epoxy or glue. However, in other embodiments the conductive plastic device 36 may be coupled to the second conductor 54 of the coaxial cable 32 using any suitable fastening means (e.g., a clamp at the ends of the conductive plastic device 36). In still other embodiments, no coupling is provided, for example, such that the coaxial cable 32 is positioned on the conductive plastic device 36, such as on top of the conductive plastic device 36 and held in place by gravity or vice versa.

In some embodiments the conductive plastic device 36 is not planar, but is curved, for example, by an angle A as shown by the curved portion in dashed lines in FIG. 3. In this embodiment, more of the surface of the conductive plastic device 36 is contact with more of the second conductor 54.

Figure 4:
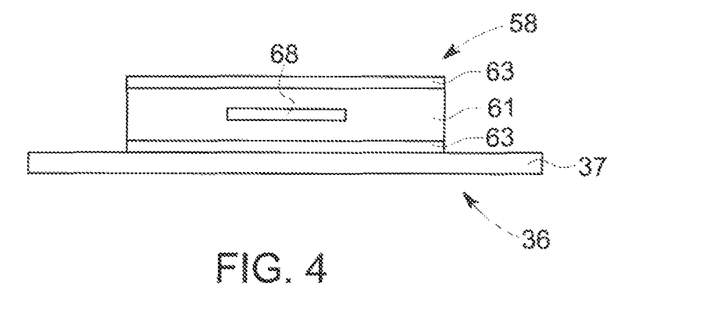
FIG. 4 is a cross-sectional view of a stripline that may be part of the transmit/receive section of FIG. 1 illustrating a conductive plastic device formed in accordance with various embodiments.

It should be noted that the conductive plastic device 36 may be used in combination with other transmission line structures. For example, as shown in FIG. 4, the conductive plastic device 36 may be implemented in combination with a stripline 58 (a cross-section of which is shown). The stripline 58 generally includes a central conductor 68 (e.g., a planar strip of metal) within a substrate 61 (e.g., a dielectric material) and between a pair of parallel ground planes 63. It should be noted that the central conductor 68 does not have to be centered between the ground planes 63 as shown, but may be closer to one of the ground planes 63.

In one embodiment, the ground planes 63 are electrically connected. For example, the two ground planes 63 on opposite sides of the substrate 61 (e.g., a printed circuit board) are electrically connected through the substrate 61 with a plurality of vias (not shown). In this embodiment, the conductive plastic device 36 is in physical contact with one of the ground planes 63, which is illustrated as the bottom ground plane 63 in FIG. 4. However, the conductive plastic device 36 similarly may be provided in contact with the upper ground plane 63. The conductive plastic device 36 may be coupled to or positioned on the ground plane 63 similar to the coupling and positioning described in connection with the coaxial cable 32.

In another embodiment, the ground planes 63 are not electrically connected. In this embodiment, a conductive plastic device 36 is in physical contact with each of the ground planes 63.

It should be noted that the coaxial cable 32 and stripline 58 are two examples of transmission lines. However, any other transmission line structure may be provided in combination with the various embodiments, such as a microstripline.

Figure 5:
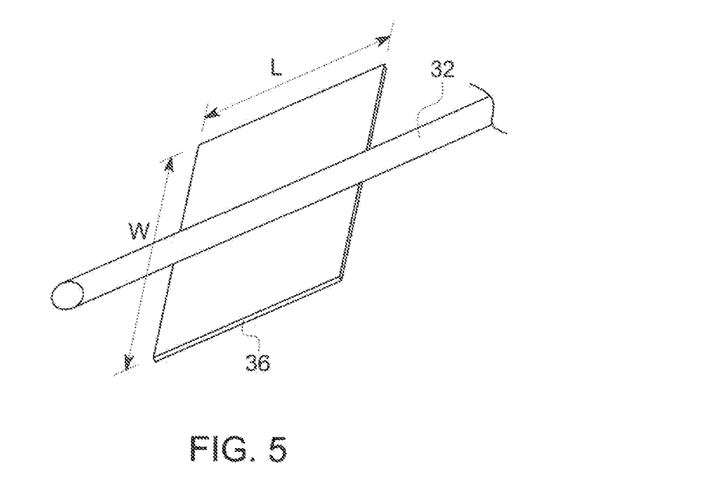
FIG. 5 is a diagram showing a conductive plastic device positioned along a coaxial cable in accordance with various embodiments.
Figure 6:
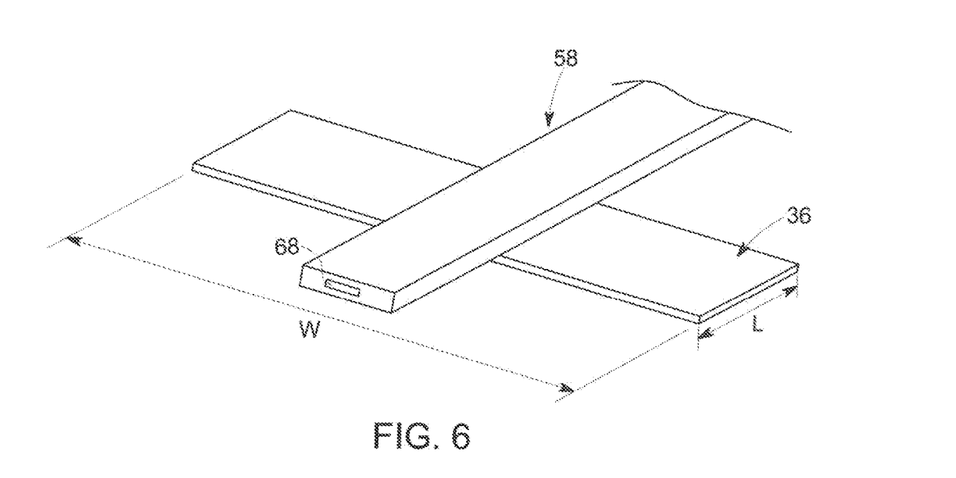
FIG. 6 is a diagram showing a conductive plastic device positioned along a stripline in accordance with various embodiments.

The size, shape, orientation, position, and/or conductivity of the conductive plastic device 36 in various embodiments is based on the damping desired or needed. For example, a length (L) and width (W) may be determined based on the damping needed for the coaxial cable 32. As can be seen in FIGS. 5 and 6, the conductive plastic device 36 may be provided as a patch type structure in contact with a portion of the second conductor 54 of the coaxial cable 32 or the stripline 58, respectively. For example, in one embodiment, the conductive plastic device 36 is a flat or slightly curved patch structure having a thickness of 1-3 millimeters (mm). However, the patch may be thicker or thinner as desired or needed, for example, based on the overall size of the conductive plastic device 36.

Figure 7:
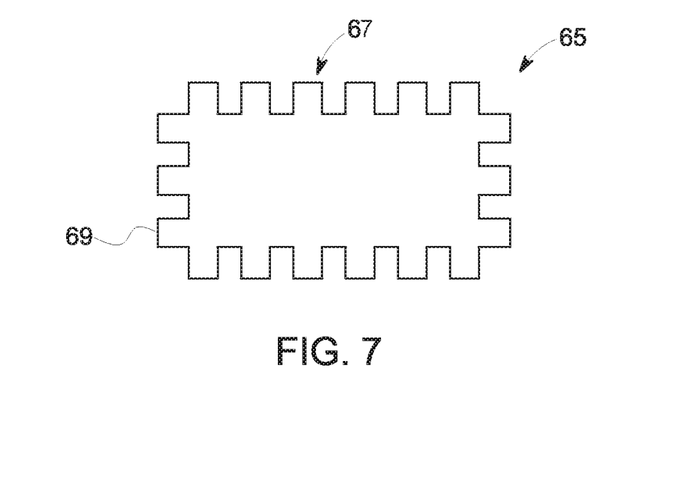
FIG. 7 is a diagram of a conductive plastic device formed in accordance with another embodiment.

In one embodiment, where the transmission line, for example, the coaxial cable 32 has a resonant length of one-half a wavelength, the conductive plastic device 36 may have a length L of about 40 mm and a width W of about 135 mm. However, the conductive plastic device 36 may a different length or width. As can be seen, in various embodiments, the longer dimension or axis of the conductive plastic device 36, in this case the width W, is positioned perpendicular to the length of the coaxial cable 32 or stripline 58 and the shorter dimension or axis of the conductive plastic device 36, in this case the length L, is positioned parallel to or along the length of the coaxial cable 32 or stripline 58. However, the conductive plastic device 36 may be aligned along different axes and/or at different orientations. It should be noted that the conductive plastic device 36 may have a shape other than rectangular. For example, as illustrated in FIG. 7, a conductive plastic device 65 may be provided that increases the length of the perimeter or circumference of the patch structure. In this embodiment, the edge 67 of the conductive plastic device 65 is tooth-shaped to provide the increased perimeter 69 or circumference. It should be noted that different shapes of the edge 67 also may be provided to increase the length of the perimeter or circumference of the patch structure.

The conductive plastic device 36 is positioned along the coaxial cable 32 at locations of highest voltage points. As described in more detail below, the highest voltage points may be determined based on the standing wave in the coaxial cable 32, in particular, the wavelength of the common mode within the length of the coaxial cable 32. Thus, the positioning of the conductive plastic device 36 in various embodiments may be determined based on the electrical length of the coaxial cable 32.

The conductive plastic device 36 may be a carbon filled polypropylene that is positioned on top of the coaxial cable 32. However, it should be noted that the conductive plastic device 36 may be formed from different materials that are non-magnetic and that include conductive particles. For example, the conductive plastic device 36 may be formed from a material having a relative permittivity of between about 1-10 Farads/meter (F/m) and a conductivity of between about 0.3-400 Siemens/meter (S/m) in various embodiments. In one embodiment, the conductive plastic device 36 has a relative permittivity of about 2.2 and a conductivity of about 3.6 S/m. However, materials with a different permittivity and conductivity may be used. The permittivity and conductivity properties of the conductive plastic device 36 may be selected or optimized based on the size and shape of the conductive plastic device 36 wherein damping is higher or maximized. For example, the conductivity of the conductive plastic device 36 may be determined so that the conductive plastic device 36 minimizes the voltages on the cable and dissipates the common mode energy in the conductive plastic device 36. In various embodiments, the conductive plastic device 36 has a conductivity that is not the same as copper, but much lower, to increase dissipation. It should be noted that the conductive plastic device 65 may be constructed from similar materials having similar properties. Also, it further should be noted that when the conductive plastic device 36 is described herein, such description generally applies to the conductive plastic device 65.

The one or more conductive plastic devices 36 are positioned along the coaxial cable 32 at high voltage points, such as determined based on the standing wave on the coaxial cable 32. For example, if the coaxial cable 32 has a resonant electrical length of one-half a wavelength (such that the maximum current is in the center of the coaxial cable 32), one conductive plastic device 36 is positioned at each end of the coaxial cable 32. As another example, if the coaxial cable 32 has a resonant length of one wavelength, a conductive plastic device 36 is positioned at each end and at the middle of the coaxial cable 32. As still another example, if the coaxial cable 32 has a resonant length of one and one-half wavelengths, a conductive plastic device 36 is positioned at each of one-third and two-thirds of the overall length of the coaxial cable 32, as well as at each end of the coaxial cable 32. In these examples, the coaxial cables 32 are open on each end. If the coaxial cables 32 are not open, but experience some complex impedance at each end (e.g., terminated by an MRI coil) then the distribution of the standing wave is different and the location of the high voltage nodes may be experimentally determined, for example, by infrared thermal imaging or simulation, as the impedance will vary the location of the high voltage points. For example, with the coaxial cable 32 subjected to an E field, a determination may be made as to the maximum current locations (based on hottest points along the coaxial cable 32) with the high voltage locations therebetween.

Figure 8:
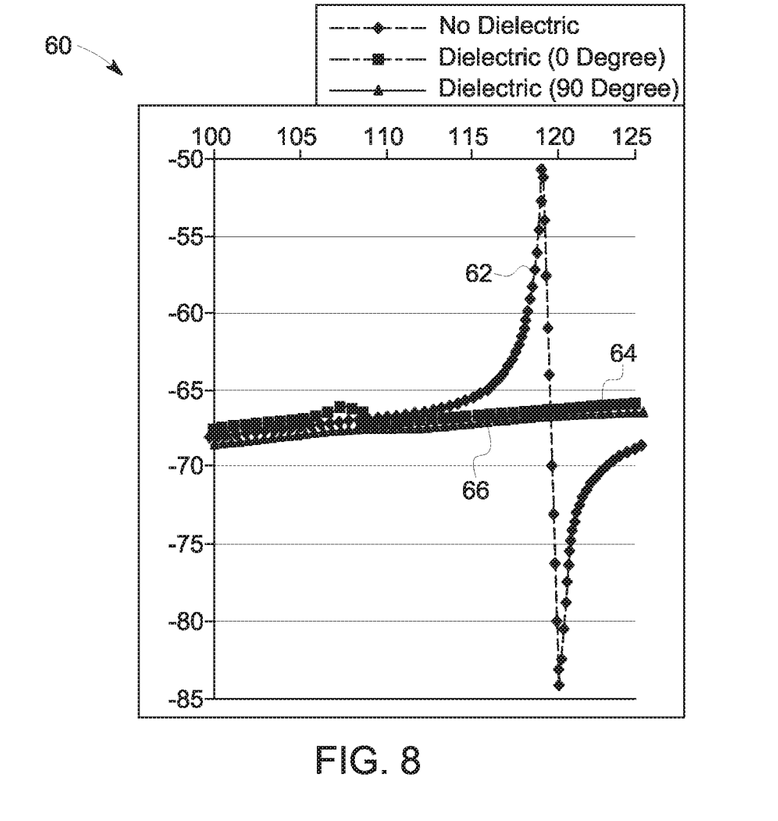
FIG. 8 is graph illustrating a common-mode reduction in a cable using various embodiments.

In various embodiments, positioning one conductive plastic device 36 at each end of the coaxial cable 32 having a resonant length of one-half wavelength, which is where the E fields are highest, provides a damping of less than −11 dB. In particular, in the graph 60 of FIG. 8, the curve 62 shows the cable mode without the conductive plastic devices 36, the curve 64 shows the cable mode with the long axis of the conductive plastic devices 36 aligned with the coaxial cable 32 and the curve 66 shows the cable mode with the long axis of the conductive plastic devices 36 aligned perpendicular to the coaxial cable 32. The graph 60 illustrates the effect of placing one 40 mm×135 mm rectangular patch, such as a rectangular conductive plastic device 36, having a conductivity of 3.6 S/m, at one end of a half-wavelength cable.

Figure 9:
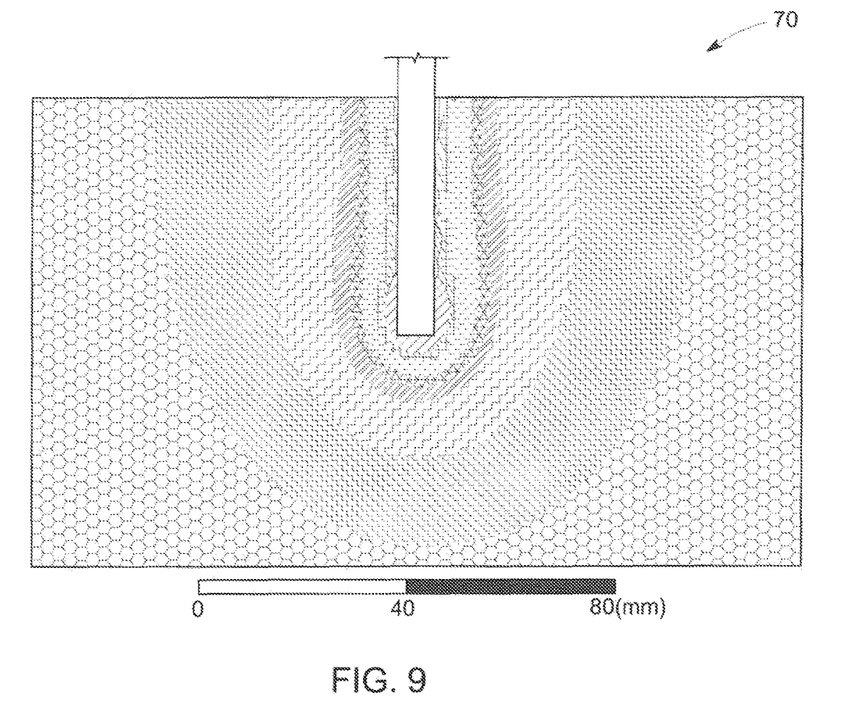
FIG. 9 is a plot of an electric (E) field of a cable without a common-mode cable current damping device in accordance with various embodiments.
Figure 10:
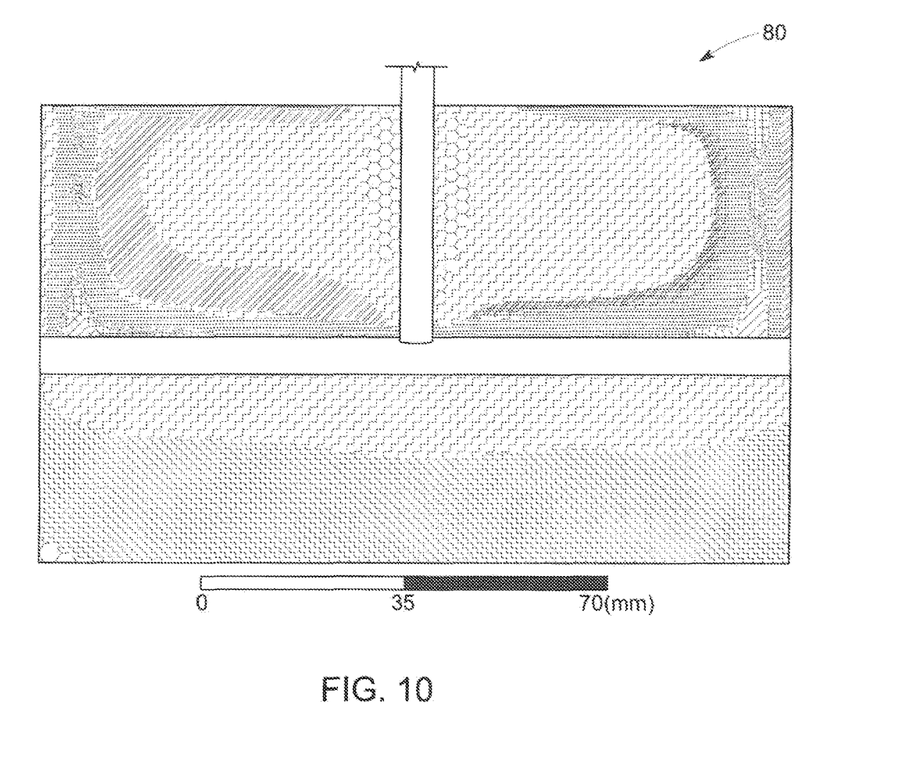
FIG. 10 is a plot of an E field of a cable with a common-mode cable current damping device in accordance with various embodiments.

Additionally, the E field plots 70 and 80 shown in FIGS. 9 and 10, respectively, show the E field of the half wavelength coaxial cable 32 without and with use of the conductive plastic devices 36, respectively. As can be clearly seen, the E field is reduced around the coaxial cable 32 as represented by the change in the E field scale from 500 in the plot 70 to 15 in the plot 80. Thus, in various embodiments, a frequency shift is provided and a dampening of the cable common-modes.

Thus, various embodiments provide one or more conductive plastic devices 36 that dissipate or dampen common-mode cable currents and/or voltages without the use of narrow band tuned baluns that work for only a single frequency. The conductive plastic device(s) 36 are positioned along the coaxial cable 32 at high intensity voltage nodes to dissipate or dampen the common-mode cable currents and/or voltages.

It should be noted that the conductive plastic device 36 may also be used for the receive coil array 24, which may be positioned within the transmit coil 22 (e.g., within the body coil). The receive coil array 24 has a RF magnetic field (B field) in addition to the RF E field. It also should be noted that common-mode currents in the receive coil cable may exist when the transmit coil 22 is not present from coupling with the E fields of the coil to which the cable is attached.

Figure 11:
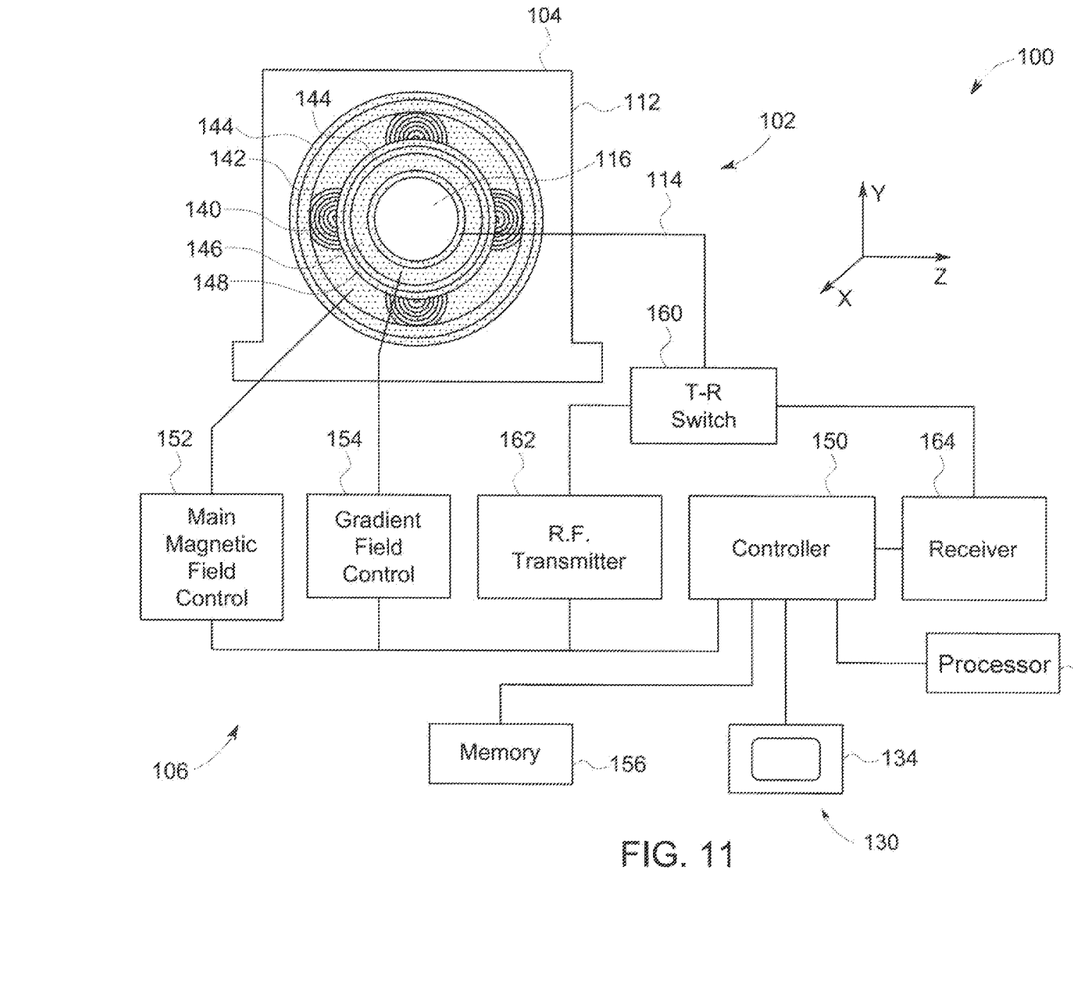
FIG. 11 is a schematic illustration of an exemplary medical imaging system in which common-mode cable energy damping may be provided in accordance with various embodiments.

Various embodiments of common-mode current damping in cables described herein may be provided as part of, or used with, a medical imaging system, such as the imaging system 100 shown in FIG. 11. It should be appreciated that although the imaging system 100 is illustrated as a single modality imaging system, the various embodiments may be implemented in or with multi-modality imaging systems. The imaging system 100 is illustrated as an MRI imaging system. Moreover, the various embodiments are not limited to medical imaging systems for imaging human subjects, but may include veterinary or non-medical systems for imaging non-human objects, luggage, etc. Additionally, the various embodiments may be implemented in connection with non-imaging systems, for example, in different power supplies, feed cables for radars, or accelerators (e.g., cyclotrons and linear accelerators).

Referring to FIG. 11, the imaging system 100 includes an imaging portion 102 having an imaging unit 104 (e.g., imaging scanner) and a processing portion 106 that may include a processor 108 or other computing or controller device. In particular, the imaging unit 104 enables the imaging system 100 to scan an object or patient to acquire image data, which may be image data of all or a portion of the object or patient. The imaging unit 104 includes one or more imaging components that allow acquisition of image data. The imaging components produce signals that represent image data that is communicated to the processing portion 106 via one or communication links 114 that may be wired or wireless. The patient may be positioned within a bore 116 using, for example, a motorized table and then MR imaging performed as described in more detail herein.

In operation, an output of one or more of the imaging components is transmitted to the processing portion 106, and vice versa, which may include transmitting signals to or from the processor through a control interface 120, which may be embodied as the system interface 30 (shown in FIG. 1). The processor 108 also may generate control signals for controlling the position of the motorized table or imaging components based on user inputs or a predetermined scan. For example, RF signals or transmit pulses may be communicated through the one or more communication link 114, which in one embodiment is embodied as a transmission line (e.g., the coaxial cable 32) having one or more conductive plastic device(s) 36 positioned along the transmission line as described in more detail herein. It should be noted that the communication link 114 may also include the coaxial cable 34 or a separate communication link 114 may be provided.

During a scan, image data, such as magnetic resonance image data from the imaging components may be communicated to the processor 108 through a data interface via the control interface, for example, as acquired by a body coil or surface coil.

The processor 108 and associated hardware and software used to acquire and process data may be collectively referred to as a workstation. The workstation 130 may include, for example, a keyboard and/or other input devices such as a mouse, a pointer, and the like, and a monitor 134. The monitor 134 displays image data and may accept input from a user if a touchscreen is available.

In the exemplary embodiment, the imaging system 100 also includes a superconducting magnet 140 formed from magnetic coils supported on a magnet coil support structure. However, in other embodiments, different types of magnets may be used, such as permanent magnets or electromagnets. A vessel 142 (also referred to as a cryostat) surrounds the superconducting magnet 140 and is filled with liquid helium to cool the coils of the superconducting magnet 140. A thermal insulation 144 is provided surrounding the outer surface of the vessel 142 and the inner surface of the superconducting magnet 140. A plurality of magnetic gradient coils 146 are provided within the superconducting magnet 140 and an RF transmit coil 148 (which may be embodied as the transmit coil 22) is provided within the plurality of magnetic gradient coils 146. In some embodiments the RF transmit coil 148 may be replaced with a transmit and receive coil as described in more detail herein. The components within the gantry 112 generally form the imaging portion 102. It should be noted that although the superconducting magnet 140 is a cylindrical shaped, other shapes of magnets can be used.

The processing portion 106 also generally includes a controller 150, a main magnetic field control 152, a gradient field control 154, a memory 156, the display device 134, a transmit-receive (T-R) switch 160, an RF transmitter 162 and a receiver 164.

In operation, a body of an object, such as the patient or a phantom to be imaged, is placed in the bore 116 on a suitable support, for example, a motorized table or other patient table. The superconducting magnet 140 produces a uniform and static main magnetic field $B_o$ across the bore 116. The strength of the electromagnetic field in the bore 116 and correspondingly in the patient, is controlled by the controller 150 via the main magnetic field control 152, which also controls a supply of energizing current to the superconducting magnet 140.

The magnetic gradient coils 146, which include one or more gradient coil elements, are provided so that a magnetic gradient can be imposed on the magnetic field $B_o$ in the bore 116 within the superconducting magnet 140 in any one or more of three orthogonal directions x, y, and z. The magnetic gradient coils 146 are energized by the gradient field control 154 and are also controlled by the controller 150.

The RF transmit coil 148 is arranged to transmit RF magnetic pulses and/or optionally detect MR signals from the patient if receive coil elements are not provided. The RF transmit coil 148 and the receive coil(s) are selectably interconnected to one of the RF transmitter 162 or receiver 164, respectively, by the T-R switch 160. The RF transmitter 162 and T-R switch 160 are controlled by the controller 150 such that RF field pulses or signals that are generated by the RF transmitter 162 are selectively applied to the patient for excitation of magnetic resonance in the patient.

Following application of the RF pulses, the T-R switch 160 is again actuated to decouple the RF transmit coil 148 from the RF transmitter 162. The detected MR signals are in turn communicated to the controller 150. The controller 150 includes a processor (e.g., image reconstruction processor), for example the processor 108, that controls the processing of the MR signals to produce signals representative of an image of the patient.

The processed signals representative of the image are also transmitted to the display device 134 to provide a visual display of the image. Specifically, the MR signals fill or form a k-space that is Fourier transformed to obtain a viewable image. The processed signals representative of the image are then transmitted to the display device 134.

Figure 12:
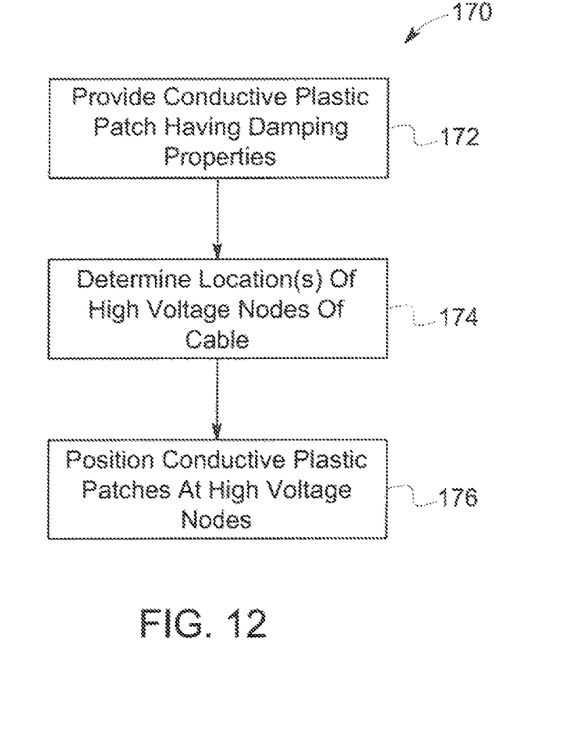
FIG. 12 is a flowchart of a method for damping or dissipating common-mode energy in a system or environment having E field(s) in accordance with various embodiments.

Various embodiments also provide a method 170 as shown in FIG. 12 for damping or dissipating common-mode cable energy (e.g., cable-mode currents and/or voltages) in a system or environment having E field(s), such as generated in an MRI system. The method 170 includes providing conductive plastic patches at 172 having particular damping properties. For example, the conductive plastic patches are formed from a material having a permittivity and conductivity to provide or optimize damping of common-mode cable currents and/or voltages as described herein, which may be based on the size, shape, conductivity, location and/or orientation of the conductive plastic patches.

The method 170 also includes determining locations of high voltage nodes of a cable within the magnetic environment at 174. For example, the resonant length of the cable may be determined to identify the high voltage nodes as described herein. The method then includes positioning the conductive plastic patches at the high voltage nodes at 176. The positioning of the conductive plastic patches at the high voltage nodes dampens, dissipates or suppresses common-mode cable currents and/or voltages in the cable.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A magnetic resonance compatible damping arrangement comprising:
   a transmission line within an electric (E) field environment, the transmission line connected to a transmit coil of a magnetic resonance imaging (MRI) system; and
   an energy damping device formed having a conductive plastic body and positioned adjacent to and in direct contact with a contacting conductor of the transmission line that is connected to the transmit coil, wherein the energy damping device is in direct physical contact with less than an entire circumference of the contacting conductor and with less than an entire length of the contacting conductor, the energy damping device being configured to dampen common-mode energy induced within the transmission line that is connected to the transmit coil by the E field environment as a result of the direct contact between the conductive plastic body and the transmission line.

2. The magnetic resonance compatible damping arrangement of claim 1, wherein the energy damping device is configured to dampen one or more currents induced in the transmission line by an E field generated within the E field environment.

3. The magnetic resonance compatible damping arrangement of claim 1, wherein the energy damping device is configured to dampen one or more voltages induced in the transmission line by an E field generated within the E field environment.

4. The magnetic resonance compatible damping arrangement of claim 1, wherein the transmission line comprises a coaxial cable and the energy damping device is positioned in physical contact with an outer conductive shield of the coaxial cable, wherein a center portion of the conductive plastic body is in contact, along a length of the conductive plastic body, with the outer conductive shield of the coaxial cable of the transmission line.

5. The magnetic resonance compatible damping arrangement of claim 1, wherein the transmission line comprises a stripline having a ground plane, and the energy damping device is positioned in physical contact with the ground plane of the stripline.

6. The magnetic resonance compatible damping arrangement of claim 1, wherein the transmission line comprises a microstripline having a ground plane, and the energy damping device is positioned in physical contact with the ground plane of the microstripline.

7. The magnetic resonance compatible damping arrangement of claim 1, wherein the conductive plastic body comprises a carbon filled plastic material.

8. The magnetic resonance compatible damping arrangement of claim 1, wherein the conductive plastic body is a planar structure extending along a length of the conductor, wherein the planar structure extends longer in a direction perpendicular to the length than along the length.

9. The magnetic resonance compatible damping arrangement of claim 1, wherein the conductive plastic body is a non-planar structure.

10. The magnetic resonance compatible damping arrangement of claim 1, wherein the energy damping device is positioned at one or more high voltage points on the transmission line.

11. The magnetic resonance compatible damping arrangement of claim 10, wherein the transmission line is a coaxial cable, and wherein a location of the one or more high voltage points is based on an electrical length of the cable and a complex termination impedance that occurs at both ends of the coaxial cable.

12. The magnetic resonance compatible damping arrangement of claim 1, wherein the transmission line is configured in order to interconnect a transmit coil to a magnetic resonance system.

13. The magnetic resonance compatible damping arrangement of claim 1, wherein the transmission line is configured in order to interconnect a receive coil to a magnetic resonance system.

14. The magnetic resonance compatible damping arrangement of claim 1, wherein the conductive plastic body is formed from a material having a relative permittivity of between 1-10 and a conductivity of between 0.3-400 Siemens/meter (S/m).

15. A magnetic resonance imaging (MRI) system comprising:
   an imaging unit having at least one transmit coil;
   a processing unit portion having at least one processor;
   a system interface interconnecting the imaging unit and the processing unit, the system interface connected to the at least one transmit coil with at least one transmission line; and
   a magnetic resonance compatible energy damping device formed having a conductive plastic body and positioned adjacent to and in direct contact with a contacting conductor of the at least one transmission line, wherein the energy damping device is in direct physical contact with less than entire circumference of the contacting conductor and with less than an entire length of the contacting conductor, the energy damping device being configured to dampen common-mode energy induced within the at least one transmission line as a result of the direct contact between the conductive plastic body and the transmission line.

16. The MRI system of claim 15, wherein the at least one transmission line comprises a coaxial cable and the energy damping device is positioned in physical contact with an outer conductive shield of the coaxial cable, wherein a center portion of the conductive plastic body is in contact, along a length of the conductive plastic body, with the outer conductive shield of the coaxial cable of one of the at least one transmission line.

17. The MRI system of claim 15, wherein the at least one transmission line comprises a stripline having a ground plane, and the energy damping device is positioned in physical contact with the ground plane of the stripline.

18. The MRI system of claim 15, wherein the at least one transmission line comprises a microstripline having a ground plane and the energy damping device is positioned in physical contact with the ground plane of the microstripline.

19. The MRI system of claim 15, wherein the conductive plastic body comprises a carbon filled plastic material.

20. The MRI system of claim 15, wherein the conductive plastic body is a planar structure extending along a length of the conductor, wherein the planar structure extends longer in a direction perpendicular to the length than along the length.

21. The MRI system of claim 15, wherein the conductive plastic body is a non-planar structure.

22. The MRI system of claim 15, wherein the energy damping device is positioned at one or more high voltage points on the at least one transmission line.

23. The MRI system of claim 15, wherein the imaging unit comprises at least one receive coil and the at least one transmission line connects the system interface to the at least one receive coil.

24. The MRI system of claim 15, wherein the imaging unit comprises at least one receive coil array and the at least one transmission line connects the system interface to the at least one receive coil array.

25. The MRI system of claim 15, wherein the conductive plastic body is formed from a material having a relative permittivity of between 1-10 and a conductivity of between 0.3-400 Siemens/meter (S/m).

26. A magnetic resonance compatible method of damping common-mode cable currents in an electric (E) field environment, the method comprising:

providing at least one conductive plastic patch having damping properties; and positioning the at least one conductive plastic patch at a high voltage node of a transmission line connected to a transmit coil of a magnetic resonance imaging (MRI) system within the E field environment in order to dampen common-mode energy induced in the transmission line by an E field of the E field environment, wherein the conductive plastic patch is in direct contact with a contacting conductor of the transmission line that is connected to the transmit coil, wherein the conductive plastic patch is in direct physical contact with less than an entire circumference of the contacting conductor and with less than an entire length of the contacting conductor, the conductive plastic patch being configured to dampen the common-mode energy induced in the transmission ling that is connected to the transmit coil as a result of the direct contact between the conductive plastic patch and the transmission line.

27. The method of claim 26, wherein the transmission line comprises a coaxial cable and the conductive plastic patch is positioned in physical contact with an outer conductive shield of the coaxial cable, wherein a center portion of the conductive plastic patch is in contact, along a length of the conductive plastic patch, with the outer conductive shield of the coaxial cable of one of the transmission line.

28. The method of claim 26, wherein the transmission line comprises a stripline having a ground plane, and the conductive plastic patch is positioned in physical contact with the ground plane of the stripline.

29. The method of claim 26, wherein the transmission line comprises a microstripline having a ground plane, and the conductive plastic patch is positioned in physical contact with the ground plane of the microstripline.

* * * * *